United States Patent [19]

Mlavsky

[11] 4,144,095
[45] Mar. 13, 1979

[54] SOLAR ENERGY ASSEMBLY

[75] Inventor: Abraham I. Mlavsky, Lincoln, Mass.

[73] Assignee: Mobil Tyco Solar Energy Corporation, Waltham, Mass.

[21] Appl. No.: 791,217

[22] Filed: Apr. 27, 1977

Related U.S. Application Data

[63] Continuation-in-part of Ser. No. 611,087, Sep. 8, 1975, Pat. No. 4,078,944.

[51] Int. Cl.² .............................................. H01L 31/06
[52] U.S. Cl. .............................. 136/89 PC; 136/89 H
[58] Field of Search ......................... 136/89 PC, 89 H; 250/239

[56] References Cited

U.S. PATENT DOCUMENTS

| | | | |
|---|---|---|---|
| 3,117,295 | 1/1964 | Luft | 338/19 |
| 3,866,285 | 2/1975 | Clark | 29/157 R |
| 3,976,508 | 8/1976 | Mlavsky | 136/89 |
| 3,988,166 | 10/1976 | Beam | 136/89 PC |
| 3,990,914 | 11/1976 | Weinstein et al. | 136/89 |
| 4,000,734 | 1/1977 | Matlock et al. | 126/271 |
| 4,021,323 | 5/1977 | Kilby et al. | 204/129 |
| 4,029,519 | 6/1977 | Schertz et al. | 136/89 PC |
| 4,045,246 | 8/1977 | Mlavsky et al. | 136/89 PC |
| 4,052,228 | 10/1977 | Russell | 136/89 PC |
| 4,056,405 | 11/1977 | Varadi | 136/89 PC |

Primary Examiner—Aaron Weisstuch
Attorney, Agent, or Firm—Schiller & Pandiscio

[57] ABSTRACT

A solar energy assembly is disclosed comprising at least one hermetically sealed envelope in which a trough-shaped radiation collector having a reflective surface is disposed so as to receive incident solar radiation through the wall of said envelope. Radiation conversion means comprising at least one solar cell is positioned inside the trough to receive radiation concentrated by the collector. The collector and the radiation conversion means may be formed as a unit for joint positioning inside the envelope. Means may be provided for orienting the envelope toward the sun and a cooling fluid may be circulated through the envelope in order to maintain the temperature below a suitable level.

9 Claims, 15 Drawing Figures

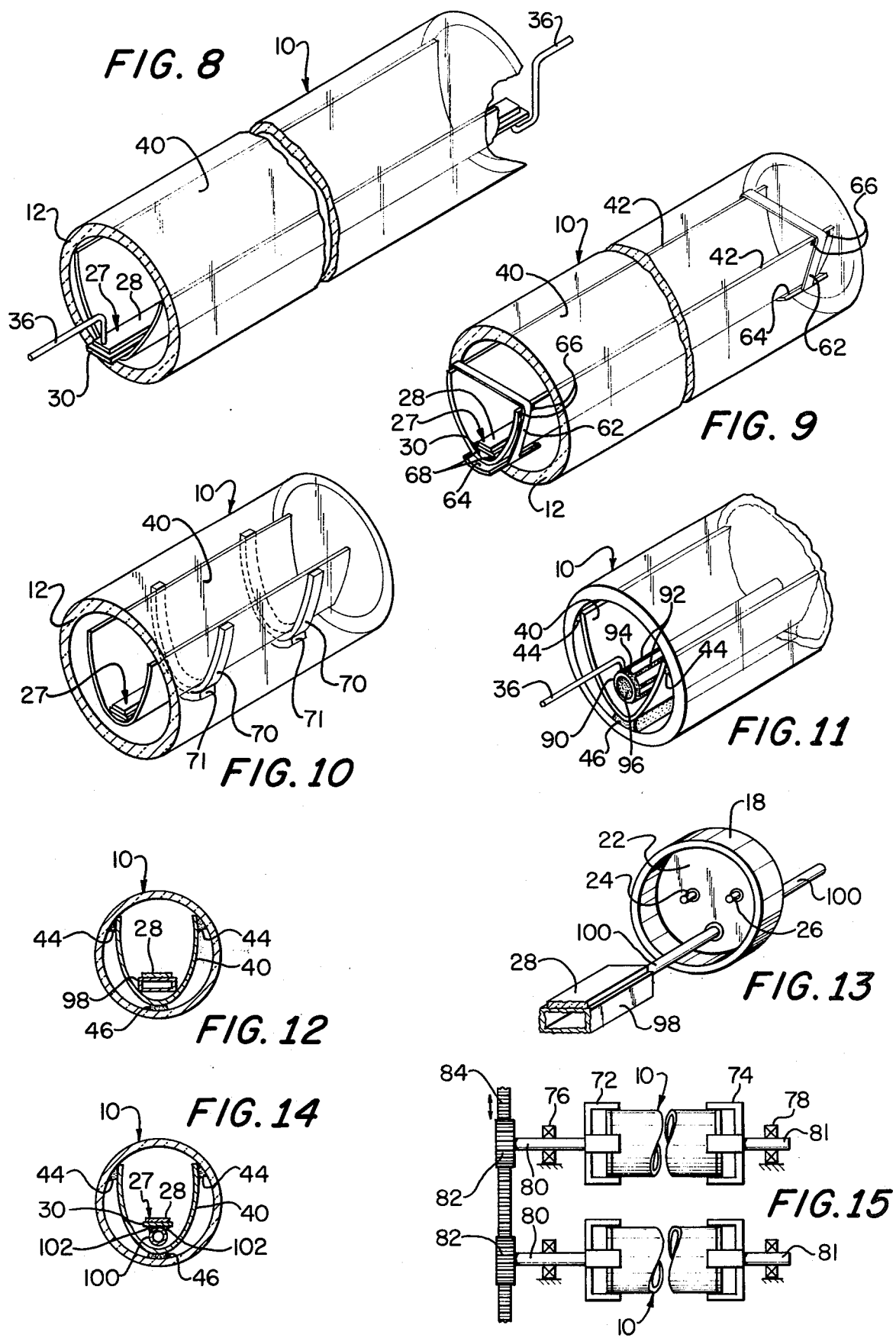

SOLAR ENERGY ASSEMBLY

BACKGROUND OF THE INVENTION

The present invention is a continuation-in-part of my co-pending U.S. Patent Application Ser. No. 611,087, filed Sept. 8, 1975, for Encapsulated Solar Cell Assembly, now U.S. Pat. No. 4,078,944.

As disclosed in the aforesaid copening application, a number of important advantages flow from encapsulating solar cells in an hermetically sealed envelope. The use of the surrounding envelope permits isolation of the relatively delicate solar cell from a hostile terrestrial or space environment. Further, instead of moving the solar cell itself to orient it toward the sun and risk damage to the cell, the envelope in which the cell is fixedly disposed may be positioned instead. The presence of the envelope also permits the solar cell to be surrounded by an inert gas so as to limit oxidation and other chemical reactions. The envelope further permits the circulation of a fluid past the cell to draw heat away from it. Finally, the envelope may be coated to admit solar radiation selectively into the envelope.

Since the area of an individual solar cell is small, the amount of current generated as a result of incident solar radiation is by necessity limited. In order to obtain electrical energy in amount that have practical utility, e.g. currents of a magnitude sufficient to drive electrical apparatus, large arrays of solar cells are ordinarily required. Such arrays are not only expensive to build, install and maintain, but their size may also render them impractical for certain applications, e.g. for transport into space, and may thus limit the practical uses of this source of energy.

It is already known to use radiation collectors, such as non-imaging light funnels, in order to concentrate relatively large amounts of incident solar radiation on a solar cell. Such collectors may take various forms, for example a compound parabolic configuration as disclosed in Review of Scientific Instruments, Vol. 37. No. 8, pp. 1094-5 (1966); ibid., Vol. 39, No. 3, pp. 419-20 (1968); and ibid., Vol. 39, No. 8, pp. 1217-8 (1968). The collectors so employed often consist of delicate lightweight material, for example of reflective foil. Hence they too are subjected to damage when exposed to a hostile environment, e.g. dulling of the reflective surface. Further, as with solar cells, damage to the collector may occur as it is moved in order to orient it toward the sun.

Although solar cells as such have been encased in hermetically sealed envelopes, as disclosed by the aforesaid copending application Ser. No. 611,087, now U.S. Pat No. 4,078,944 heretofore a number of technical obstacles, a related primarily to positioning and securing the components inside the envelope have militated against all attempts at encapsulating a solar cell in combination with a collector.

OJBECTS OF THE INVENTION

Accordingly, it is a primary object of the present invention to provide radiation conversion means in combination with a radiation collector in a fully protected environment.

It is another object of the present invention to provide radiation conversion means fixedly positioned in an hermetically sealed glass envelope in combination with a collector.

It is a further object of the present invention to provide radiation conversion means formed as a unit with a solar collector and supported as such in a hermetically sealed envelope.

It is still another object of the present invention to provide an hermetically sealed envelope wherein a unit, comprising radiation conversion means, a collector and mounting means, is disposed positionally invarient in the envelope.

These and other objects of the present invention together with the features and advantages thereof will become apparent from the following detailed specification when read in conjunction with the accompanying drawings in which like reference numerals refer to corresponding parts.

BRIEF DESCRIPTION OF THE DRAWINGS

FIG. 8 illustrates an arrangement wherein the radiation conversion means and the radiation collector are supported as a unit;

FIG. 9 illustrates a further embodiment of mounting elements usable in the present invention;

FIG. 10 illustrates still another embodiment of mounting elements usable in the present invention;

FIG. 11 illustrates an embodiment of the invention which uses s substantially tubular solar cell;

FIG. 12 illustrates an embodiment wherein a flat solar cell is supported on a cooling conduit;

FIG. 13 illustrates the manner in which the conduit of FIG. 12 is supported;

FIG. 14 illustrates another embodiment for supporting the solar cell on a cooling conduit; and FIG. 15 illustrates an arrangement for orienting a plurality of envelopes toward the source of radiation.

DESCRIPTION OF THE INVENTION

Figure 1:
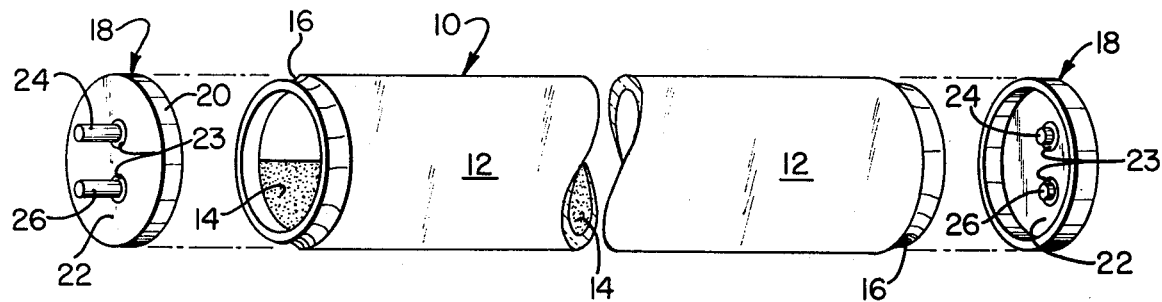
FIG. 1 illustrates an envelope of the type that may be used in the present invention.

FIG. 1 illustrates a preferred embodiment of an envelope 10 of the type used in the present invention. The envelope comprises a wall 12 which is preferably shaped to form a cylindrical tube and which consists of a vitreous or crystalline material adapted to admit actinic solar radiation. As shown at 14, a portion of the inside of tube 10 may be coated. For example, a reflective coating may be applied to the lower portion of the tube such that solar radiation will be admitted only through the upper portion. The ends 16 of tube 10 are adpated to mate with flanges 20 of end caps 18 in hermetically sealing relationship. The ends of tube 10 may have a reduced diameter as shown or the tube may have a constant cross-sectional size throughout its length, with the end caps sized accordingly to make a tight fit. Each end cap further includes an end wall 22 as well as a pair of conductive posts 24 and 26 respectively, which extend through the end wall to the interior of tube 10. Preferably the end caps are made of metal and posts 24 and 26 are fixed in seals 23 of glass or other electrically insulating material. The end caps are hermetically secured to the ends of the envelope by suitable means, e.g. by a cement.

Although envelopes of different shapes and materials may be employed, a glass tube of cyindrical shape is preferred. In a preferred embodiment of the invention the type of tube and end caps employed in commercially available fluorescent lights may be used, provided that the cylindrical tube wall is clear to admit actinic radiation to the solar cell. Thus, posts 24 and 26, which are commonly found on fluorescent lights, perform the same function, i.e. to hold the tube in place and to establish electrical connections.

Figure 2:
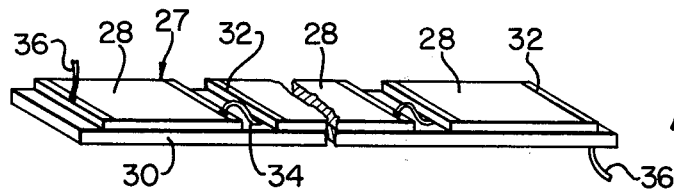
FIG. 2 illustrates exemplary radiation conversion means of the type that may be employed in the present invention.

FIG. 2 illustrates an exemplary radiation conversion means 27. Although a single solar cell may be employed, in a preferred embodiment of the invention the radiation conversion means forms a flat, elongate block wherein a plurality of solar cells 28 is positioned on a substrate 30. The substrate is required only where the solar cell itself has insufficient strength to be self-supporting. Such additional support is required for solar cells made of materials such as silicon and the like which are too brittle or too thin to permit extensive handling.

Each solar cell has positive and negative terminals positioned on the upper and lower surfaces, respectively. Examples of the arrangement of terminals on such cells are shown in U.S. Pat. Nos. 3,686,036; 3,973,996 and 3,982,964 and in the references cited in these patents.

If they are coupled in series, successively positioned solar cells are connected to each other positive-to-negative, as illustrated at 34 in FIG. 2. If they are coupled in parallel, all positive terminals are connected together and likewise all negative terminals are connected. A pair of wires 36 is adapted to electrically connect radiation conversion means 27, either to a single one of the posts on each of the two end caps 18, or to posts 24 and 26 of a single end cap.

Figures 3, 4:
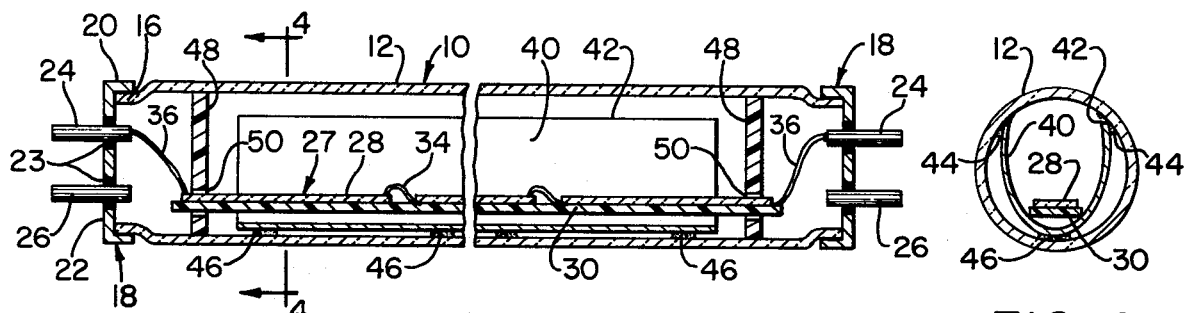
FIG. 3 illustrates an assembled envelope in accordance with the present invention.
FIG. 4 is a cross-sectional view of FIG. 3 taken at line 4—4.

FIGS. 3 and 4 illustrate one embodiment of the present invention wherein a radiation collector 40, preferably in the shape of a compound parabolic trough, is positioned inside envelope 10. In a preferred embodiment of the invention the collector consists of a single continuous sheet, made of steel, aluminum or the like, which has a highly reflective inner surface. Alternatively, the collector may consist of a sheet of plastic or a molded glass member which has a reflective film deposited on its inner surface. The collector extends in an axial direction inside the tube, its length being roughly comparable to the length of radiation conversion means 27.

The trough-form sheet of the collector includes a pair of edges 42 which are parallel to the axis of the tube. As shown in FIG. 4, edges 42 may be fastened to cylindrical glass wall 12, e.g. by means of an adhesive 44. The adhesive need not be applied throughout the length of edges 42, but may be placed only at the extremes of these edges. In order to maintain collector 40 positionally invariant inside the envelope, adhesive is also applied between the outside surface of the trough bottom, and the inside surface of wall 12, as indicated by reference numeral 46. Here again, the adhesive is applied at least at the ends of the trough.

In one embodiment of the invention the material chosen for the collector sheet may be resilient and the dimensions of the tube are such as to compress the sides of the collector toward each other. Thus, the collector seeks to expand beyond the confines of cylindrical wall 12 and edges 42 bear resiliently against the wall. Under these conditions, adhesive 44 may be dispensed with.

A number of different mounting elements may be advantageously used with the present invention. In the embodiment illustrated by FIG. 3, a pair of mounting disks 48 is positioned at opposite ends of tube 10, the disks being preferably affixed to wall 12 by means of an adhesive. Each disk 48 includes an aperture 50 through which radiation conversion means 27 extends. In the case of the embodiment illustrated in FIG. 3, substrate 30 as well as solar cell 28 extends through the aperture, the latter by an amount sufficient to expose a terminal on the other side of mounting disk 48 for connection to post 24 by means of wire 36.

In the embodiment of the invention described so far, the collector and the radiation conversion means are separately supported inside tube 10. It is frequently preferable to assemble the collector and the radiation conversion means outside the tube and to insert and position them as a unit thereafter. Thus, substrate 30 may be adhesively attached at its long edges to a continuation wheet sheet comprises collector 40, provided the sheet has the requisite strength. Under certain conditions, if solar cell 28 consists of a sufficiently strong non-brittle material, substrate 30 may be dispensed with and the requisite support for the solar cell is provided by collector 40 alone. With the components thus fastened together into a unit, the latter may be inserted into the tube. By subsequently attaching collector 40 adhesively to wall 12, e.g. as shown at 44 and 46 in FIG. 4, the inserted unit as a whole is positionally fixed within the envelope.

As previously explained, in a preferred embodidment of the invention the envelope may use the tube of a fluorescent light whose wall 12 has been left uncoated. If radiation conversion means 27 is connected as shown in FIG. 3, only post 24 of each end cap 18 is used for an electrical connection. Thus, if the posts are hollow, one of posts 26 may be used to fill the tube with an inert gas which helps maintain stable conditions inside the tube. Alternatively, both posts 26 may be used as convenient access means in order to circulate a cooling fluid, e.g. an inert gas, through the tube to help contain the temperature rise that will occur due to the well known greenhouse effect. It will be understood that special access means, e.g. another tubular member extending through the end walls may be used for the foregoing purposes in lieu of posts 26, as explained in greater detail below.

Figure 5:
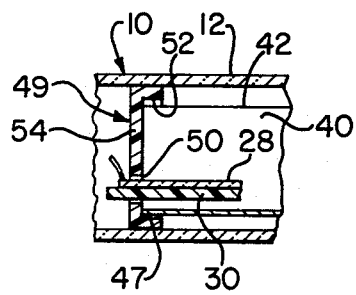
FIG. 5 illustrates another embodiment of mounting elements that are usable in the present invention.

FIG. 5 illustrates a varient embodiment of a mounting element, which may be used in lieu of each of disks 48 in FIG. 3. A single mounting element 49 is illustrated which is provided with a lip 52 and a circular wall 54. Collector 40 extends to the inside surface of the circular wall. Edges 42, only one of which is shown in FIG. 5, may be adhesively fastened to the inside surface of lip 52, in similar manner to the analogous arrangement illustrated in FIG. 4. Alternatively, collector 40 may consist of a resilient material, such that edges 42 bear resiliently against lip 52. As in the embodiment of FIG. 4, the outside bottom surface of the collector trough also may be anchored by being adhesively affixed to lip 52, as shown at 47.

In similar manner to the embodiment illustrated in FIG. 3, substrate 30 and solar cell 28 both extend through aperture 50 of mounting element 40 and they are adhesively affixed therein. As a consequence, collector 40 are radiation conversion means 27 form a unit with a pair of mounting elements 49, all parts of which are fixedly secured together. This unit may be assembled outside of tube 10 and inserted as such into the tube.

Figure 6:
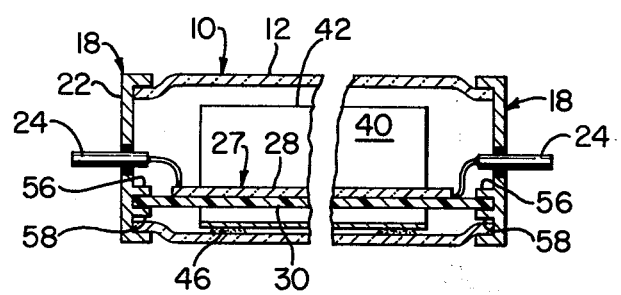
FIG. 6 illustrates a further embodiment of the present invention wherein the mounting function is performed by the end caps of the envelope.

FIG. 6 illustrates a further embodiment of the invention wherein the end cpas provide support for the components inside the envelope. Tube 10 is shown rotated by 90° so that only post 24 is visible. As illustrated, end wall 22 of each end cap 18 is formed with a pair of lips 56 and 58 on its interior surface. The lips receive substrate 30 of the radiation conversion means therebetween and thus provide support to the latter at both ends of tube 10. The substrate is adhesively affixed to lips 56 and 58, and, therefore, special mounting elements for supporting the radiation conversionn means may be dispensed with. In the embodiment illustrated in FIG. 6, collector 40 may be independently supported within the envelope, e.g. in the manner illustrated and explained in connection with FIG. 4. Alternatively, radiation conversion means 27 and collector 40 may be adhesively or otherwise secured together to form a unit. In the latter case, no further supporting means is required to position collector 40.

Figure 7:
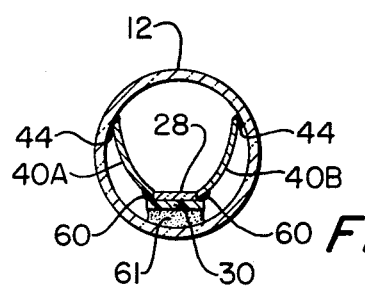
FIG. 7 illustrates another embodiment of a collector that may be used in the present invention.

FIG. 7 illustrates a further embodiment of the present invention in which the collector is formed as a pair of sheets 40A and 40B. Each such sheet is adhesively attached to substrate 30, as indicated by reference numeral 60, as well as to cylindrical wall 12, as show at 44. Thus, sheets 40A and 40B form the sides of a trough, the bottom of which is formed by solar cell 28. Substrate 30 is adhesively affixed to wall 12, as shown at 61, so as to secure the entire structure in place.

In a preferred embodment of the invention, the radiation conversion means consisting of substrate 30 and solar cells 28 is very light in weight and therefore requires only minimal support. The same is also true for collector 40 which is formed either from a thin metallic sheet, or from a sheet of plastic having a reflective covering applied to its interior surface. As shown in FIG. 8, the lightness of the unit so formed permits it to be supported solely by wires 36, which couple the solar cell to posts 24, provided that the wires are stiff enough for the purpose. Thus, special mounting elements are not required to the unit. It will be understood that if collector 40 is independently supported in the tube, wires 36 may be utilized to support the radiation conversion means alone.

FIG. 9 illustrates still another embodiment of the present invention in which ring-form mounting elements 62 are employed which encircle collector 40. Elements 62 may be either circular or they may have flat sides. A broadened base 64 is affixed to the interior surface of the wall 12. Base 64 may be either continuous, or it may be split to permit the mounting element to be bent to the precise desired shape.

As shown, ring-form mounting elements 62 completely surround collector 40. The collector is adhesively affixed to elements 62, at least at location 66 and preferably also at base 64. The arrangement illustrated in FIG. 9 finds particular utility where collector 40 comprises a compressed resilient sheet, as described above, whose edges 42 bear resiliently against the inside surface of mounting elements 62. Further, substrate 30 of radiation conversion means 27 is adhesively affixed to the interior surface of collector 40, as shown at 68. Thus, radiation conversion means 27, collector 40 and mounting elements 62 are secured together to form a unit which may be inserted into tube 10 and positioned therein by adhesively affixing base 64 to wall 12.

As explained above, the protection afforded by tube 10 permits the use of relatively delicate components. For example, the sheet comprising collector 40 may consist of a thin reflective foil which may be formed into a compound parabolic shape or other suitable shape in a relatively simple and inexpensive manner. In order to maintain the desired shape suitable mounting elements are required, e.g. a plurality of yoke-shaped holders 70 spaced at intervals along the length of tube 10, as shown in FIG. 10. In such an arrangement, mounting elements 70 are preferably secured adhesively to the bottom of tube 10, as shown at 71. Radiation conversion means 27 are, however, preferably supported independently by one of the techniques described above due to the lack of strength of the foil.

FIG. 11 illustrates another embodiment of the invention wherein the radiation conversion means comprises a tubular solar cell 90 instead of the flat cell illustrated in connection with the embodiments discussed hereinabove. The solar cell may be of the type disclosed in U.S. Pat. No. 3,976,508, such that the body of the cell consists of semi-conductive material having an outer radiation-receiving region of a first conductivity type and an inner region of a second, opposite conductivity type and havingelectrodes disposed on the inner and outer surface respectively. Cell 90 comprises a hollow cylinder and in a preferred embodiment the other electrode may consist of a grid of conductors 92 disposed on the outer cylinder surface and equipotentially connected throughout. Grid 92 includes a pair of end conductors 94, only one of which is shown in FIG. 11. End conductor 94 may be connected to one of the posts in the end caps of tube 10 by means of a wire 36 in the manner explained above. The electrode disposed on the inner surface may consist of a conductive coating 96 which may be similarly connected by means of a wire (not shown) to the outside of tube 10. As explained in connection with the embodiment of FIG. 8, wires 36 may be sufficiently stiff to support cell 90 positionally invariant within tube 10. Collector 40 may be independently supported within tube 10, e.g. by means of adhesive, as shown at 44 and 46.

One of the advantages that flows from the use of a tubular solar cell, as compared to a flat solar cell, is the ability to receive radiation substantially on all portions of its outer surface. A further disadvantage afforded is the ability of circulating a cooling liquid directly through the solar cell by properly coupling conduit connections to the outside of tube 10.

FIGS. 12 and 13 illustrate another embodiment of the invention wherein flat solar cell 28 is supported on a cooling conduit 98 which has a substantially rectangular cross-section. The conduit consists preferably of a heat-conductive material, e.g. aluminum or the like, which is supported at each end by end wall 22 of end cap 18. In order to facilitate the manner of sealing the condiut as it passes through the end wall, a conduit 100 of circular cross-section is employed at the end wall itself. By means of a suitable transition well known in the art, conduit 98, which has a rectangular cross-section, is transformed into conduit 100. Thus, in the embodiment which is illustrated in FIGS. 12 and 13, substrate 30 which supports the solar cell may be omitted.

Although collector 40 is capable of being independently positioned within tube 10, e.g. by the use of an adhesive indicated at 44 and 46 in FIG 12, it may be secured to conduit 98 instead. In the latter case, the collector, the conduit and solar cell 28 may be independently assembled outside of tube 10 and inserted as a unit.

FIG. 14 illustrates a further embodiment wherein radiation conversion means 27 includes the solar cell and the substrate structure described above and represented by reference numerals 28 and 30 respectively. However, in the embodiment of FIG. 14, substrate 30 consists of a heat-conductive material which is secured to cooling conduit 100 by means of adhesive or the like, as indicated at 102 in the drawing. Thus, the arrangement illustrated in FIG. 14 permits the use of a cylindrical cooling conduit throughout without the necessity of the transition required by the embodiment of FIGS. 12 and 13.

FIG. 15 illustrates a solar energy assembly wherein a plurality of tubes 10, each containing components as discussed above, may be oriented toward the sun. Each tube is rotatably disposed about its own axis. A pair of clamps 72 and 74, which are coupled to a pair of shafts 80 and 81 respectively, hold opposite ends of the tube. Shafts 80 and 81 are journaled in a pair of bearings 76 and 78 respectively, each shaft 80 being further coupled to a toothed gear 82 which engages a toothed gear rack 84. The arrangement is substantially identical for all tubes 10. Rack 84 may be moved back and forth in the direction of the arrow illustrated, so as to rotate each tube 10 about its own axis. The movement of rack 84 may be implemented in a number of well known ways, e.g. by means of suitable sun position sensing means and a servo control which constantly causes tubes 10 to be oriented toward the sun. Alternatively, timing means may be employed which may provide periodic positioning, e.g. a diurnal position adjustment.

It will be readily apparent that many modifications of the above-described invention suggest themselves within the scope of the present invention. For example, as pointed out above, different types of materials may be used for the collector sheet, provided only that a reflective interior surrace is provided and that the sheet has the desired trough-shaped configuration to concentrate solar radiation received through wall 12 onto solar cell 18. Depending on the precise configuration of the trough, radiation so directed at the solar cell may be due in part to incident radiation striking the cell directly, as well as to single and multiple reflections from the interior collector surface. While the trough-like collector may be a simple parabola in cross-section, it is preferred that the sides of the collector have a compound parabolic curvature like the collectors disclosed by Roland A. Winston in U.S. Pat. No. 4,003,638.

As pointed out above, the invention is not limited to the use of a single solar cell. A plurality of such cells may be disposed on a single substrate or, alternatively, the substrate may be dispensed with if the strength of the solar cell material permits.

Although end caps are shown as terminating envelope 10, an hermetic seal may be provided in other ways as well. Further, the tube need not be cylindrical in shape, but may have different types of cross-section. However, cylindrical tubes of the kind used in fluorescennt lights are preferred since they are commercially available at low cost, are reliable, and the technology of affixing the end caps and filling the tubes with a gas is well developed and reliable.

A number of different inplementations for separately supporting the radiation conversion means within tube 10 are illustrated and described above. As pointed out, the collector and the radiation conversion means may also be secured together to form a unit which may, under some conditions, include a pair of mounting elements. Thus, the various implementations disclosed herein for supporting individual components are similarly applicable to support a unit formed of such components connected together.

While the collector and the radiation conversion means are generally of comparable length, these lengths may vary with respect to each other by small amounts in order to accomplish the desired supporting function. Thus, where the connecting wires provide support, the radiation conversion means preferably extends beyond the collector at both end of the latter. Similarly, where the substrate of the radiation conversion means is supported by the lips formed on the interior surface of the end caps, the radiation conversion means also exceeds the collector in length. On the other hand, where ring-shaped mounting elements are employed, it may be preferably to terminate the radiation conversion means short of the ends of the collector to prevent shading by the mounting means as solar radiation strikes from above.

Various types of materials may be used for the mounting elements. In one embodiment of the invention the mounting elements consist of a resilient material so as to relieve stress due to the unequal expansion of the components when the interior of tube 10 heats up.

While an inert cooling fluid may be introduced through a hollow conduit formed by post 26, the invention is not so limited. Under certain conditions it may be desirable to introduce the cooling fluid through special openings provided for that purpose in the end wall of each end cap, using a special fitting for the purpose.

The apparatus illustrated and described for orienting the tubes toward the sum is intended to be exemplary only. Numerous ways exist of journaling tubes 10 to adapt them for rotation around their respective axes and for jointly driving and controlling the rotation of a plurality of such tubes.

From the foregoing discussion, it will be apparent that numerous variations, modifications and substitutions will now occur to those skilled in the art, all of which fall within the spirit and scope contemplated by the present invention. Accordingly, the invention is intended to be limited only by the scope of the appended claims.

What is claimed is:

1. A solar energy assembly comprising, in combination:

at least one hermetically sealed tubular envelope;

said envelope including a center axis and a wall adapted to pass incident solar radiation to the interior of said envelope;

a radiation collector disposed inside said envelope and adapted to concentrate said solar radiation received through sais wall, said collector having a configuration at least partially defining an elongated trough open to said incident radiation and extending substantially parallel to said center axis;

radiation conversion means positioned inside said envelope to receive said concentrated radiation, said radiation conversion means including at least one solar cell adapted to provide a current in response to said concentrated radiation;

means for electrically connecting said radiation conversion means to the exterior of said hermetically sealed envelope; and means, including at least two mounting elements, for supporting at least said radiation collector within said tube positionally invariant relative to said envelope, each of said mounting elements at least partially encircling said trough, at least the bottom of said trough being secured to said mounting means.

2. Apparatus according to claim 1 wherein said radiation conversion means, said collector and said mounting elements are fixedly secured together to form a unit capable of being jointly positioned within said tube.

3. Apparatus according to claim 1 wherein each of said mounting elements comprises a disk including an aperture, opposite ends of said radiation conversion means extending through said apertures and being secured therein.

4. Apparatus according to claim 1 wherein said mounting elements comprise a plurality of yokes spaced along the length of said tube and adapted to receive said trough therein.

5. A solar energy assembly comprising, in combination:

at least one hermetically sealed envelope;

said envelope including a wall adapted to pass incident solar radiation to the interior of said envelope;

a radiation collector disposed inside said envelope adapted to concentrate said solar radiation received through said wall;

radiation conversion means positioned inside said envelope to receive said concentrated radiation, said radiation conversion means including at least one solar cell adapted to provide a current in response to said concentrated radiation;

means for electrically connecting said radiation conversion means to the exterior of said hermetically sealed envelope; and conduit means extending through said envelope for supporting said radiation conversion means and for conducting a cooling fluid through said envelope.

6. Apparatus according to claim 5 wherein said conduit means comprises a hollow conduit adapted for the passage of said fluid therethrough, said conduit being heat-conductive.

7. Apparatus according to claim 6 wherein said conduit means includes a hollow, heat-conductive conduit for circulating a cooling liquid through said envelope, at least a portion of said conduit having a substantially rectangular cross-section including a flat external surface, said radiation conversion means being supported by said conduit in contact with said flat surface.

8. Apparatus according to claim 6 wherein said conduit means includes a hollow, heat-conductive conduit of substantially circular cross-section for circulating a cooling liquid through said tube, said radiation conversion means being secured to the outside of said conduit.

9. Apparatus according to claim 8 wherein said radiation conversion means includes a heat-conductive substrate supported on said conduit, said solar cell being positioned on said substrate.

* * * * *